(12) United States Patent
Pan et al.

(10) Patent No.: US 7,319,372 B2
(45) Date of Patent: Jan. 15, 2008

(54) IN-PLANE MECHANICALLY COUPLED MICROELECTROMECHANICAL TUNING FORK RESONATORS

(75) Inventors: Zhiyu Pan, Mountain View, CA (US); Rob Norris Candler, Stanford, CA (US); Markus Lutz, Palo Alto, CA (US); Aaron Partridge, Palo Alto, CA (US); Volker Materna, Boetzingen (DE); Gary Yama, Mountain View, CA (US); Wilhelm Frey, Stuttgart (DE)

(73) Assignees: Board of Trustees of the Leland Standford Junior University, Standford, CA (US); Robert Bosch GmbH, Stuttgart (DE)

( * ) Notice: Subject to any disclaimer, the term of this patent is extended or adjusted under 35 U.S.C. 154(b) by 234 days.

(21) Appl. No.: 11/182,299

(22) Filed: Jul. 15, 2005

(65) Prior Publication Data

US 2007/0013464 A1    Jan. 18, 2007

(51) Int. Cl.
   *H03H 9/50*    (2006.01)
   *H03H 9/21*    (2006.01)
(52) U.S. Cl. ............... 333/197; 333/200; 310/370
(58) Field of Classification Search ............ 333/197, 333/200; 310/370
   See application file for complete search history.

(56) References Cited

U.S. PATENT DOCUMENTS

| | | | |
|---|---|---|---|
| 3,659,230 A * | 4/1972 | Tanaka et al. ............ 333/200 |
| 5,187,458 A * | 2/1993 | Yamashita et al. .......... 333/197 |
| 6,249,073 B1 | 6/2001 | Nguyen et al. |
| 6,577,040 B2 | 6/2003 | Nguyen |
| 6,624,726 B2 | 9/2003 | Niu et al. |
| 6,628,177 B2 | 9/2003 | Clark et al. |
| 6,831,531 B1 * | 12/2004 | Giousouf et al. .......... 333/200 |
| 6,898,832 B2 * | 5/2005 | Kawashima .............. 29/25.35 |
| 6,922,118 B2 * | 7/2005 | Kubena et al. ............ 333/188 |
| 7,068,125 B2 * | 6/2006 | Lutz et al. ................ 333/186 |
| 2002/0041220 A1 | 4/2002 | Nguyen |
| 2004/0085159 A1 | 5/2004 | Kubena et al. |
| 2004/0095210 A1 | 5/2004 | Nguyen |
| 2004/0207492 A1 | 10/2004 | Nguyen et al. |

OTHER PUBLICATIONS

Ho, K. et al.; "Through-Support-Coupled Micromechanical Filter Array", 17th International Micro Electro Mechanical Systems (MEMS), 2004, pp. 769-772.*

(Continued)

*Primary Examiner*—Barbara Summons
(74) *Attorney, Agent, or Firm*—Kenyon & Kenyon LLP

(57) ABSTRACT

There are many inventions described and illustrated herein, as well as many aspects and embodiments of those inventions. In one aspect, the present invention is directed to a resonator architecture including a plurality of in-plane vibration microelectromechanical resonators (for example, 2 or 4 resonators) that are mechanically coupled to provide, for example, a differential signal output. In one embodiment, the present invention includes four commonly shaped microelectromechanical tuning fork resonators (for example, tuning fork resonators having two or more rectangular-shaped or square-shaped tines). Each resonator is mechanically coupled to another resonator of the architecture. For example, each resonator of the architecture is mechanically coupled to another one of the resonators on one side or a corner of one of the sides. In this way, all of the resonators, when induced, vibrate at the same frequency.

14 Claims, 13 Drawing Sheets

OTHER PUBLICATIONS

"Mechanically Corner-Coupled Square Microresonator Array for Reduced Series Motional Resistance", Demirci et al., Dig. of Tech. Papers, the 12th Int. Conf. on Solid-State Sensors & Actuators (Transducers '03), Boston, Massachussets. Jun. 8-12, 2003, pp. 955-958.

"High-Q Single Crystal Silicon HARPSS Capecitive Beam Resonators with Self-Aligned Sub-100nm Transduction Gaps", Pourkamali et al., Journal of Microelectromechanical Systems, vol. 12, No. 4, Aug. 2003, pp. 487-496.

* cited by examiner

Tuning Fork Resonator 12-18

Tuning Fork Resonator 12-18

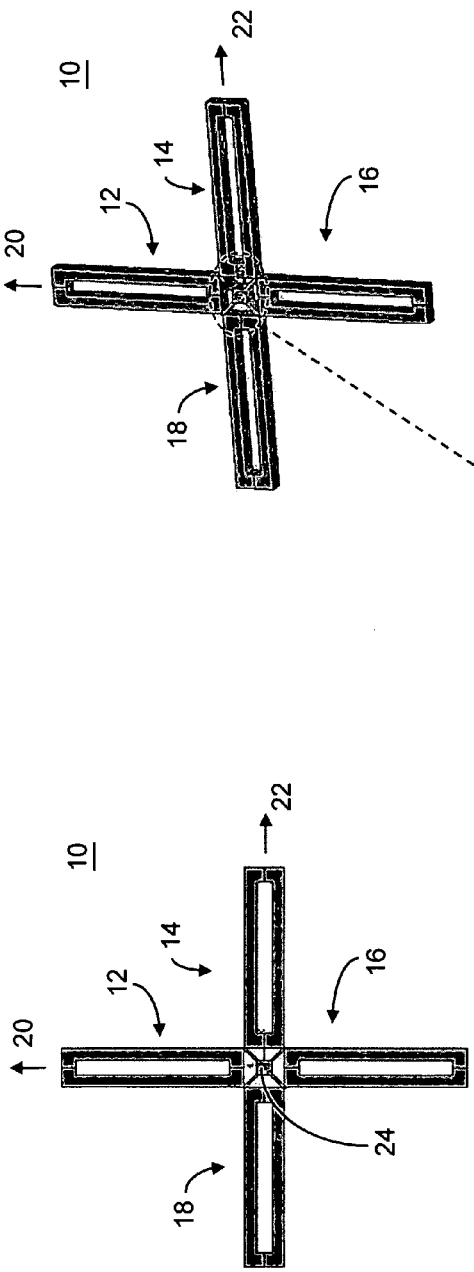
FIGURE 3A
FIGURE 3B
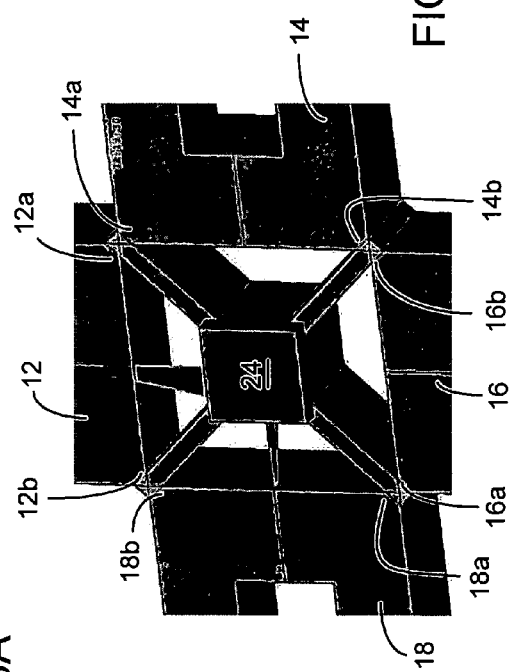
FIGURE 3C

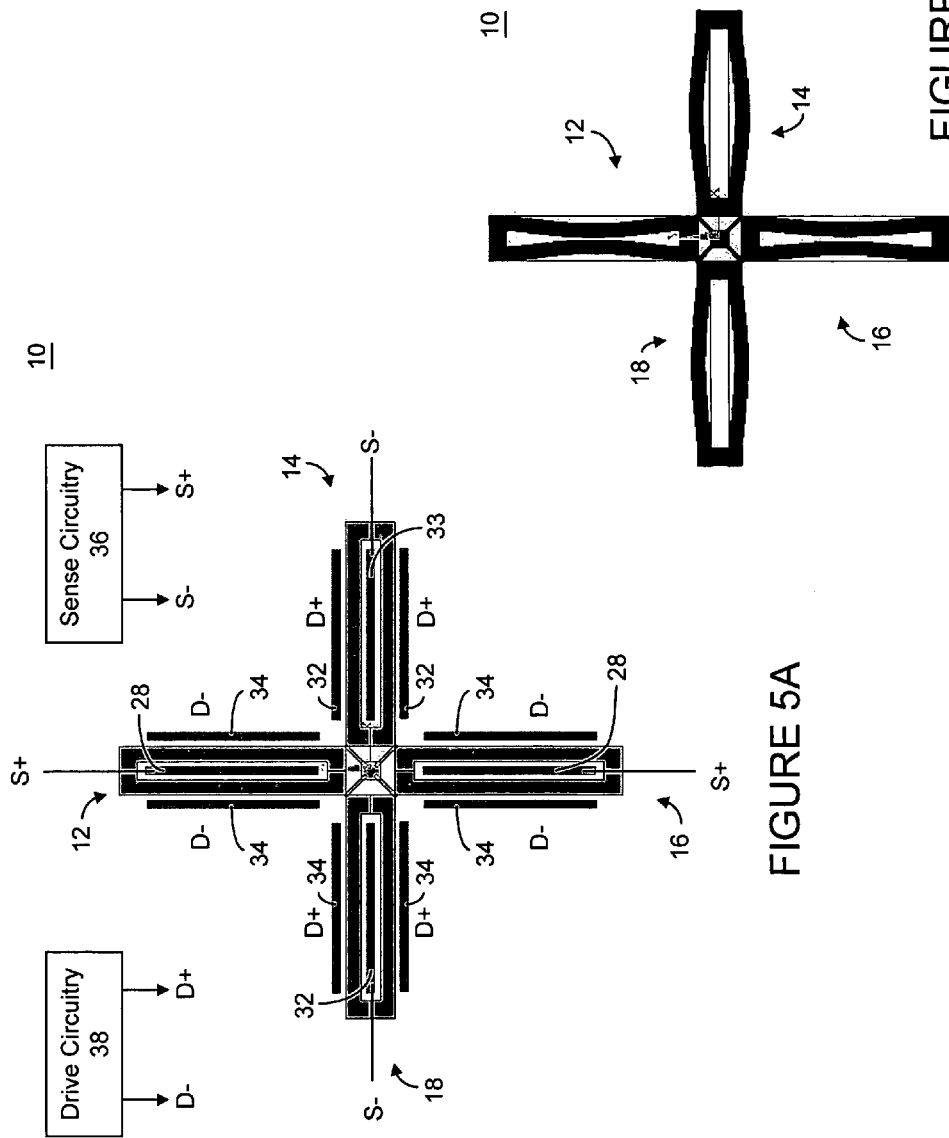

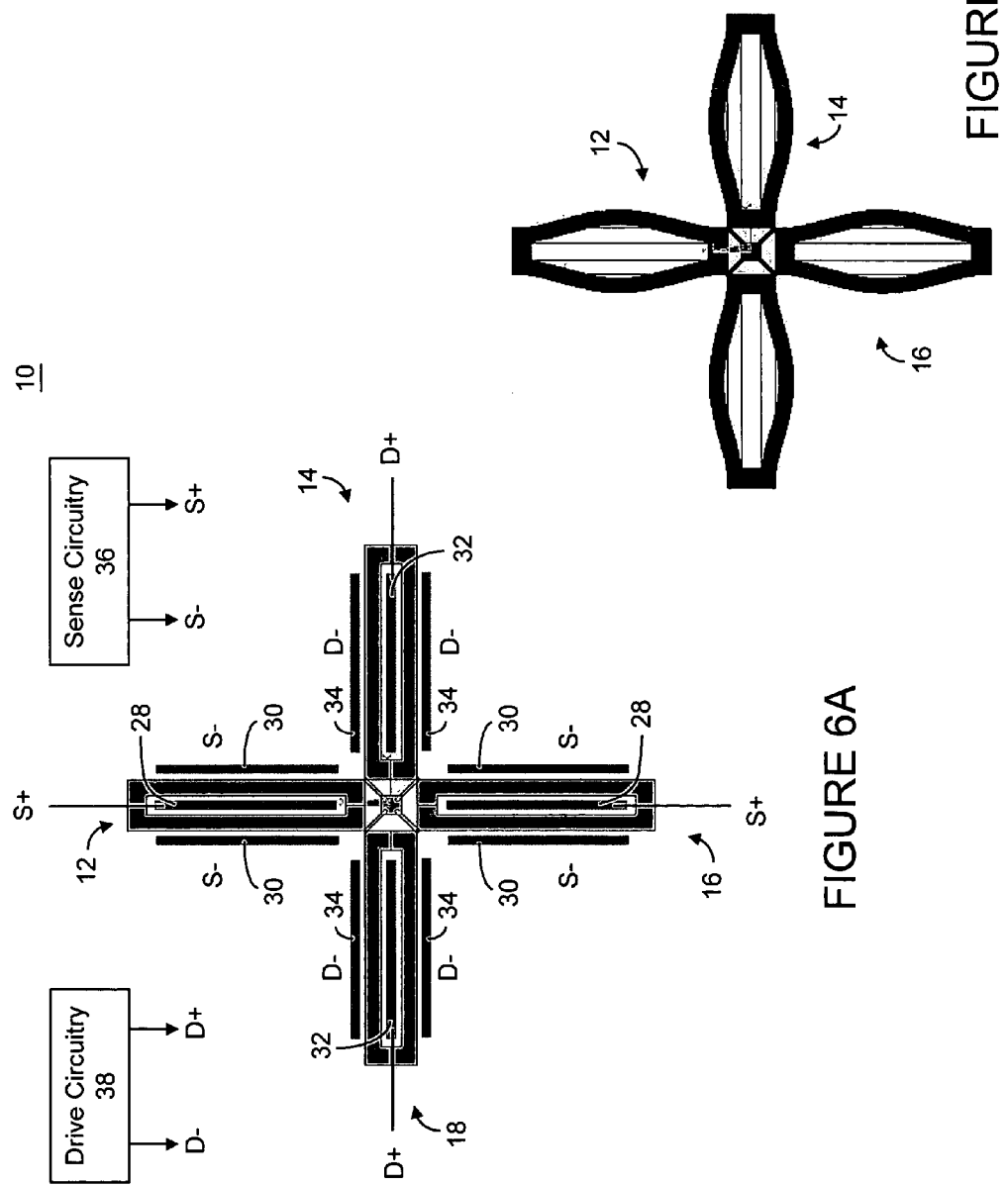

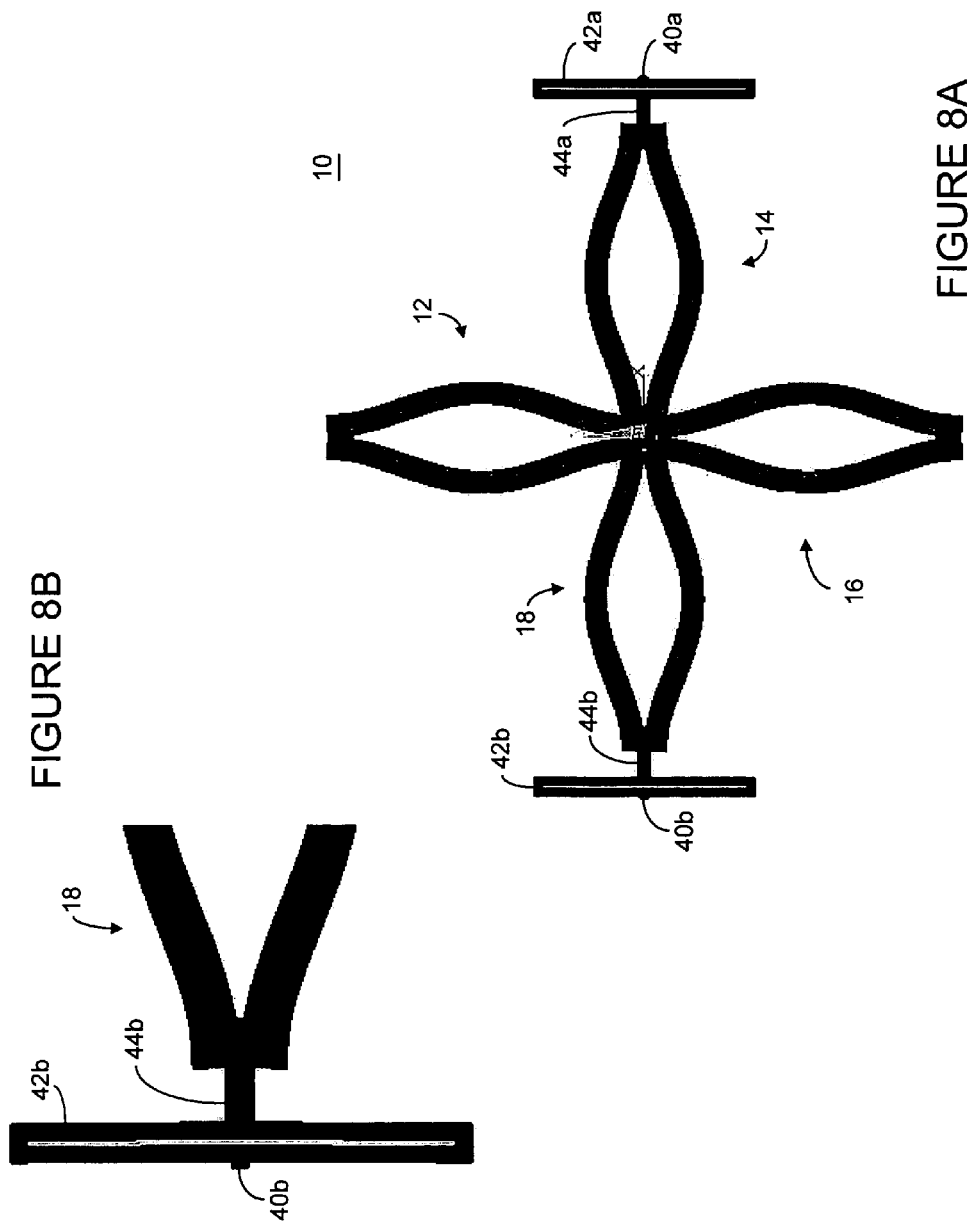

IN-PLANE MECHANICALLY COUPLED MICROELECTROMECHANICAL TUNING FORK RESONATORS

This invention was made with Government support under contracts N66001-03-1-8942 and 28920-A awarded by the Defense Advanced Research Projects Agency. The Government has certain rights in this invention.

BACKGROUND

This invention relates to a microelectromechanical resonator architecture; and more particularly, in one aspect, to a resonator architecture including a plurality of in-plane vibration microelectromechanical resonators that are mechanically coupled and may provide a differential signal output.

Generally, high Q microelectromechanical resonators are regarded as a promising choice for integrated single chip frequency references, filters and sensors. In this regard, high Q microelectromechanical resonators tend to provide high frequency outputs that are suitable for many high frequency applications requiring compact and/or demanding space constrained designs. However, when the output frequency of the resonator is "pushed" higher while being scaled smaller, the motional resistance of such devices tends to dramatically increase. As such, the motional resistance of such resonators should be minimized and/or reduced in order to match impedance and maximize the amplitude of the output signal.

There are a number of conventional techniques to decrease the motional resistance, including: (1) adjusting (i.e., increasing) the DC bias voltage, (2) adjusting (i.e., decreasing) electrode-to-resonator gap space, and (3) implementing an array of mechanically coupled identical resonators. The first two techniques are well known and often effective, but include significant shortcomings, for example, an increase in nonlinearity as a result of increasing the DC bias and scaling the gap space. Moreover, to achieve a very narrow gap often leads to a significant increase in the complexity of the fabrication processes.

An array of identical mechanically-coupled resonators has been proposed to decrease motional resistance while improving linearity. (See, for example, U.S. Pat. No. 6,628,177 and "Mechanically Corner-Coupled Square Microresonator Array for Reduced Series Motional Resistance", by Demirci et al., Transducers 2003, pp. 955-958). However, care must be taken during the fabrication processes. That is, such resonators often are required to fabricated with high precision in order to manufacture an array of identical mechanically-coupled resonators with precisely identical resonant frequency.

Moreover, conventional microelectromechanical resonator arrays include both out-of-plane motion as well as in-plane motion type resonators. The out-of-plane vibration mode type resonator is not a commonly employed architecture. In this regard, out-of-plane vibration mode (i.e., transverse mode) requires a bottom driving and sensing electrodes at the cost of parasitic capacitance between drive/sense electrodes and the substrate. Such capacitance may lead to a higher noise floor of the output signal (in certain designs). In addition, the resonator requires at least one additional mask to fabricate, as compared to the in-plane vibration resonator, in order to define the drive/sense electrode.

Although conventional microelectromechanical resonator arrays propose an in-plane vibrating mode type resonator, the inputs and outputs of such microelectromechanical resonators are not fully differential. Accordingly, such conventional microelectromechanical resonator arrays tend to be more susceptible to noise since the lack of full differential signaling may lead to poor immunity to noise on the input signals and/or the output signals.

Thus, there is a need for a system and technique to overcome the shortcomings of one, some or all of the conventional microelectromechanical resonator arrays. In this regard, there is a need for an improved microelectromechanical resonator array that includes relatively small motional resistance and good linearity, implements full differential signaling and/or possesses a high immunity to noise on the input signals and/or the output signals.

SUMMARY OF THE INVENTION

There are many inventions described and illustrated herein, as well as many aspects and embodiments of those inventions. In a first principal aspect, the present invention is a resonator array for providing at least one output signal (for example, a differential outputs), the resonator array comprising a plurality of in-plane vibration microelectromechanical tuning fork resonators, including first, second, third and fourth tuning fork resonators. The first resonator of this embodiment includes a tuning fork configuration (for example, a tuning fork having a closed or open, substantially square or substantially rectangular shape). The first resonator includes two or more tines wherein each tine includes a distal end and a proximal end. The second resonator includes a distal end and a proximal end, wherein the proximal end of the second resonator is mechanically coupled to the proximal end of the first resonator, and wherein the shape of the second resonator is substantially identical to the first resonator. The third resonator includes a distal end and a proximal end, wherein the proximal end of the third resonator is mechanically coupled to the proximal end of the second resonator, and wherein the shape of the third resonator is substantially identical to the second resonator. The fourth resonator includes a distal end and a proximal end, wherein the proximal end of the fourth resonator is mechanically coupled to the proximal end of the first resonator, and wherein the shape of the fourth resonator is substantially identical to the third resonator.

In one embodiment, a first corner of the proximal end of the first resonator is mechanically coupled to a first corner of the proximal end of the second resonator and a second corner of the proximal end of the second resonator is mechanically coupled to a second corner of the proximal end of the third resonator. Moreover, a first corner of the proximal end of the third resonator is mechanically coupled to a first corner of the proximal end of the fourth resonator and a second corner of the proximal end of the fourth resonator is mechanically coupled to a second corner of the proximal end of the first resonator.

In another embodiment, the resonator array may include a coupling junction wherein the proximal end of each of resonator is mechanically coupled to the coupling junction via coupling supports. The coupling junction may include an anchor to fix the resonator array to a substrate.

Further, in one embodiment, the resonator array may include a first anchor to fix the resonator array to a substrate and a first stress/strain relief mechanism coupled to the first anchor and the distal end of the first resonator. The resonator array may also include a second anchor to fix the resonator array to a substrate and a second stress/strain relief mechanism coupled to the second anchor and the distal end of the third resonator.

The resonator array may include a plurality of sense electrodes and drive electrodes. In one embodiment, the resonator array includes (i) a first sense electrode is juxtaposed a first outer surface of the first electrode, (ii) a second sense electrode is juxtaposed a second outer surface of the first electrode, (iii) a third sense electrode is juxtaposed a first outer surface of the third electrode, (iv) a fourth sense electrode is juxtaposed a second outer surface of the third electrode, (v) a fifth sense electrode is disposed between a first and a second inner surface of the first electrode, and (vi) a sixth sense electrode is disposed between a first and a second inner surface of the first electrode. In this embodiment, the resonator array includes (i) a first drive electrode is juxtaposed a first outer surface of the second electrode, (ii) a second drive electrode is juxtaposed a second outer surface of the second electrode, (iii) a third drive electrode is juxtaposed a first outer surface of the fourth electrode, (iv) a fourth sense electrode is juxtaposed a second outer surface of the fourth electrode, (v) a fifth sense electrode is disposed between a first and a second inner surface of the third electrode, and (vi) a sixth sense electrode is disposed between a first and a second inner surface of the fourth electrode.

In yet another embodiment, the resonator array may include (i) a first sense electrode is disposed between a first and a second inner surface of the first electrode, (ii) a second sense electrode is disposed between a first and a second inner surface of the second electrode, (iii) a third sense electrode is disposed between a first and a second inner surface of the third electrode, and (iv) a fourth sense electrode is disposed between a first and a second inner surface of the fourth electrode. In this embodiment, (i) a first drive electrode is juxtaposed a first outer surface of the first electrode, (ii) a second drive electrode is juxtaposed a second outer surface of the first electrode, (iii) a third drive electrode is juxtaposed a first outer surface of the second electrode, (iv) a fourth drive electrode is juxtaposed a second outer surface of the second electrode, (v) a fifth drive electrode is juxtaposed a first outer surface of the third electrode, (vi) a sixth drive electrode is juxtaposed a second outer surface of the third electrode, (vii) a seventh drive electrode is juxtaposed a first outer surface of the fourth electrode, and (viii) an eighth drive electrode is juxtaposed a second outer surface of the fourth electrode.

In a second principal aspect, the present invention is a resonator array for providing, for example, a differential output signal, the resonator array of this aspect includes a plurality of in-plane vibration microelectromechanical tuning fork resonators. The resonator array of this aspect of the invention includes a first resonator having a tuning fork configuration having a closed or open, substantially rectangular shape, wherein the first resonator includes a plurality of tines such that each tine of the first resonator includes a distal end and a proximal end. The second resonator includes a distal end and a proximal end, wherein the proximal end of the second resonator is mechanically coupled to the proximal end of the first resonator, and wherein the shape of the second resonator is substantially identical to the first resonator. The third resonator includes a distal end and a proximal end, wherein the proximal end of the third resonator is mechanically coupled to the proximal end of the second resonator, and wherein the shape of the third resonator is substantially identical to the second resonator. The fourth resonator includes a distal end and a proximal end, wherein the proximal end of the fourth resonator is mechanically coupled to the proximal end of the first resonator, and wherein the shape of the fourth resonator is substantially identical to the third resonator. In addition, the resonator array of this aspect of the invention includes a coupling junction wherein the proximal end of each of resonator is mechanically coupled to the coupling junction via coupling supports.

In one embodiment, the coupling junction includes an anchor to fix the resonator array to a substrate. In another embodiment, the resonator array includes a first anchor to fix the resonator array to a substrate and a first stress/strain relief mechanism coupled to the first anchor and the distal end of the first resonator. The resonator array may also include a second anchor to fix the resonator array to a substrate and a second stress/strain relief mechanism coupled to the second anchor and the distal end of the third resonator.

The resonator array of this aspect may also include a plurality of sense electrodes and drive electrodes. Indeed, such sense electrodes and drive electrodes may be configured as discussed above.

In a third principal aspect, the present invention is a resonator array for providing a differential output signal, the resonator array of this aspect includes a plurality of a resonators (for example, two or four) having tuning fork configurations which include a closed or open. Other than the number of and shape of the tines of the resonators, the resonator array of this aspect of the present invention may be the same or similar to the second principal aspect of the present invention. For the sake of brevity, those discussions will not be repeated.

Again, there are many inventions described and illustrated herein. This Summary of the Invention is not exhaustive of the scope of the present invention. Moreover, this Summary of the Invention is not intended to be limiting of the invention and should not be interpreted in that manner. While certain embodiments, features, attributes and advantages of the inventions have been described in this Summary of the Invention, it should be understood that many others, as well as different and/or similar embodiments, features, attributes and/or advantages of the present inventions, are apparent from the description, illustrations and claims, which follow.

BRIEF DESCRIPTION OF THE DRAWINGS

In the course of the detailed description to follow, reference will be made to the attached drawings. These drawings show different aspects of the present invention and, where appropriate, reference numerals illustrating like structures, components, materials and/or elements in different figures are labeled similarly. It is understood that various combinations of the structures, components, materials and/or elements, other than those specifically shown, are contemplated and are within the scope of the present invention.

FIG. 3A is a top view of one embodiment of a microelectromechanical resonator device, including a plurality of in-plane vibration microelectromechanical resonators, having a tuning fork configuration including two elongated members having a rectangular shape, according to one aspect of present invention;

FIG. 3B is an oblique view of the microelectromechanical resonator device of FIG. 3A;

FIGS. 3C and 4B are oblique views of the coupling junction of the microelectromechanical resonator device of FIG. 3B;

FIG. 5A illustrates an embodiment of a microelectromechanical resonator device, including a plurality of in-plane vibration microelectromechanical tuning fork resonators, drive and sense electrodes, and drive and sense circuitry, according to an aspect of present invention;

FIG. 5B illustrates the in-plane vibration or resonation of the plurality of microelectromechanical tuning fork resonators of the MEMS resonator device of FIG. 5A;

FIG. 6A illustrates another embodiment of a microelectromechanical resonator device, including a plurality of in-plane vibration microelectromechanical tuning fork resonators, drive and sense electrodes, and drive and sense circuitry, according to an aspect of present invention;

FIG. 6B illustrates the in-plane vibration or resonation of the plurality of microelectromechanical tuning fork resonators of the microelectromechanical resonator device of FIG. 6A;

FIG. 8A illustrates the in-plane vibration or resonation of the plurality of microelectromechanical tuning fork resonators, in conjunction with stress/strain relief mechanisms which are mechanically connected to anchors, of the microelectromechanical resonator device of FIG. 7B;

FIG. 8B illustrates a portion of one or the microelectromechanical resonators of FIG. 8A;

DETAILED DESCRIPTION

There are many inventions described and illustrated herein, as well as many aspects and embodiments of those inventions. In one aspect, the present invention is directed to a resonator architecture including a plurality of in-plane vibration microelectromechanical tuning fork resonators (two or more tuning fork members or tines that are open or closed ended (i.e., attached to one another other at one or two ends)) that are mechanically coupled to provide a differential signal output. In one embodiment, the present invention includes four commonly shaped microelectromechanical tuning fork resonators (for example, four rectangular-shaped or square-shaped resonators). Each tuning fork resonator is mechanically coupled to another tuning fork resonator of the architecture. For example, the tuning fork resonators may include two or more elongated members or tines that are rectangular-shaped or square-shaped. Each tuning fork resonator of the architecture may be mechanically coupled to another one of the tuning fork resonators on one side (for example, a corner of one of the sides of the rectangular-shaped or square-shaped resonators) of the rectangular-shaped or square-shaped resonator. In this way, all of the tuning fork resonators, when induced, vibrate at the same frequency.

Notably, the present inventions are described in the context of microelectromechanical systems. The present inventions, however, are not limited in this regard. Rather, the inventions described herein are applicable to other electromechanical systems including, for example, nanoelectromechanical systems. Thus, the present inventions are pertinent to microelectromechanical and nanoelectromechanical systems (hereinafter collectively "MEMS" unless specifically noted to the contrary), for example, gyroscopes, resonators, and/or accelerometers, implementing one of the resonator architectures of the present inventions.

Figure 1:
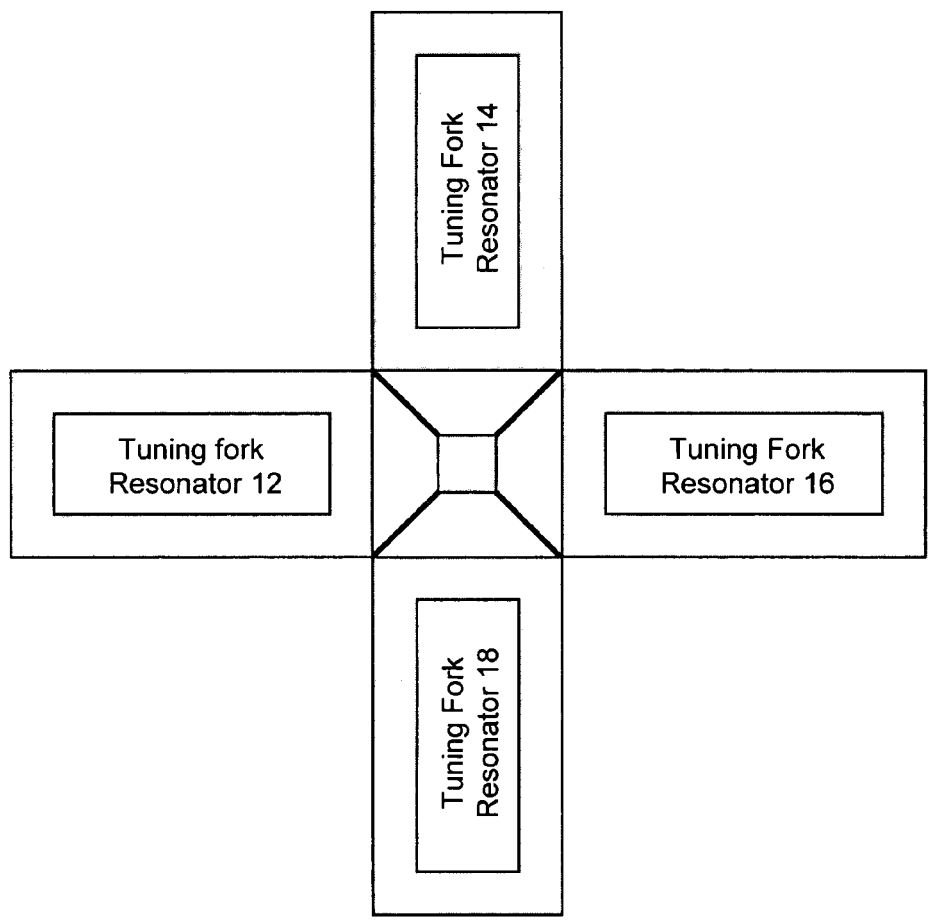
FIG. 1 is a schematic block diagram representation of a microelectromechanical resonator device, including a plurality of in-plane vibration microelectromechanical resonators, having a tuning fork configuration, according to one aspect of present invention.
Figure 2A:
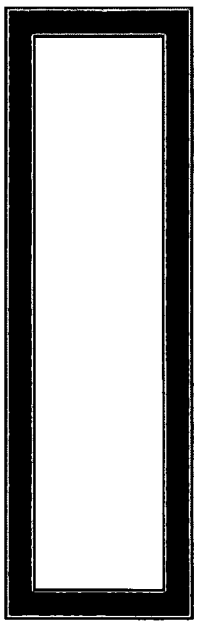
FIG. 2A is a top view of one embodiment of a microelectromechanical tuning fork resonator having two elongated members, each including a rectangular shape, that are in a closed-ended configuration, according to one embodiment of one aspect of present invention.
Figure 2B:
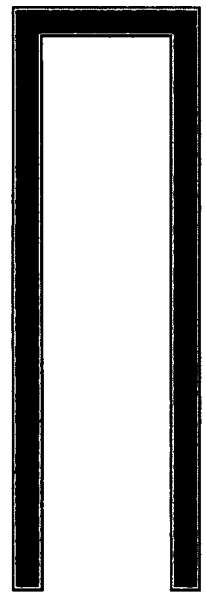
FIG. 2B is a top view of one embodiment of a microelectromechanical tuning fork resonator having two elongated members, each including a rectangular shape, that are in an open-ended configuration, according to one embodiment of one aspect of present invention.

In one embodiment, with reference to FIG. 1, MEMS resonator device 10 may include first tuning fork resonator 12, second tuning fork resonator 14, third tuning fork resonator 16 and fourth tuning fork resonator 18. Each of the tuning fork resonators may include one or more elongated members or tines (see, for example, FIGS. 2A and 2B) that are closed-ended (see, for example, FIG. 2A) or open-ended (see, for example, FIG. 2B). The elongated members or tines of the tuning fork resonators 12-18 may have any shape.

With reference to FIGS. 3A, 3B and 3C, in one embodiment, MEMS resonator device 10 includes rectangular shaped tuning fork resonators 12-18. Each of tuning fork resonators 12-18 may include two or more members or tines, having an inner surface and an outer surface, that is open or closed ended. In this embodiment, the resonators 12-18 are closed ended and two of the resonators (for example, resonators 12 and 16) are disposed in a first direction along first axis 20 and two of the resonators (for example, resonators 14 and 18) are disposed in a first direction along second axis 22.

Further, resonators 12-18 are mechanically coupled to another resonator at a first proximal end of the resonator. That is, in one embodiment, resonator 12 is mechanically coupled to resonator 14 at corner 12a and mechanically coupled to resonator 18 at corner 12b. The resonator 14 is mechanically coupled to resonator 12 at corner 14a and mechanically coupled to resonator 16 at corner 14b. Further, resonator 16 is mechanically coupled to resonator 14 at corner 16b and mechanically coupled to resonator 18 at corner 16a. Finally, resonator 18 is mechanically coupled to resonator 16 at corner 18a and mechanically coupled to resonator 12 at corner 18b.

Figure 4B:
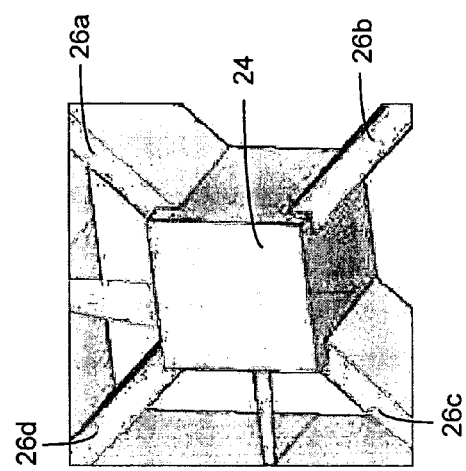
Figure 4A:
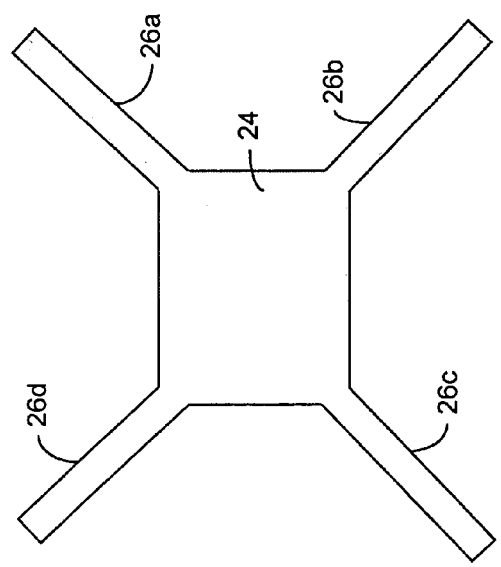
FIG. 4A is a top view of the coupling junction of the microelectromechanical resonator device of FIG. 3A.

In this embodiment, resonators 12-18 are mechanically coupled to coupling junction 24 via junction supports 26a-26d. (See, for example, FIGS. 4A and 4B). Although coupling junction 24 is illustrated as a substantially square feature, other shapes are suitable, for example, circular, rectangular and elliptical.

In one embodiment, coupling junction 24 may also anchor MEMS resonator device 10 to a substrate. Such an anchoring configuration may be advantageous because the center is an effective motionless node point of MEMS resonator device 10, at which vertical and horizontal energy losses of MEMS resonator device 10 are minimized. In this way, MEMS resonator device 10 (and, in particular, resonators 12-18) may include a high quality factor, Q.

Moreover, as discussed in more detail below, in operation, implementing a symmetrical driving/sensing technique for the symmetrical structures of MEMS resonator device 10, provides a low stress point at coupling junction 24, which may further minimize, reduce and/or eliminate energy loss.

Notably, as discussed below, MEMS resonator device 10 may be anchored to a substrate using other anchoring configurations.

The sense and drive electrodes and circuitry are configured to provide output signals that are (or are substantially) 180 degrees out of phase. In this way, MEMS resonator device 10 provides a differential output signal pair which includes a relatively large signal to noise relationship due to the summing affects of the symmetrical resonator pairs (for example, a first pair consisting of resonators 12 and 16, and a second pair consisting of resonators 14 and 18). Notably, the sense and drive circuitry may be conventional well-known circuitry.

With reference to FIG. 5A, in one embodiment, sense electrodes 28 and 30 are located juxtaposed to the resonators (here, resonators 12 and 16) located along a first axis (here, axis 20) and drive electrodes 32 and 34 are located juxtaposed to the resonators (here, resonators 14 and 18) located along a second axis (here, axis 22). In particular, in this embodiment, first (positive) sense electrodes may be electrodes 28 and second (negative) sense electrodes may be electrodes 30. The first (positive) drive electrodes may be electrode 32 and the second (negative) drive electrodes may be electrodes 34.

The sense circuitry 36 is coupled to sense electrodes 28 and 30 to sense the output signal. The drive circuitry 38 is coupled to drive electrodes 32 and 34 to drive and/or stimulate MEMS resonator device 10 to resonate. In this regard, MEMS resonator device 10 of FIG. 5A vibrates or resonates, in-plane, to generate output signals that are (or are substantially) 180 degrees out of phase. (See, FIG. 5B). As mentioned above, sense circuitry 36 and drive circuitry 38 may be conventional well-known circuitry. Indeed, sense circuitry 36 and/or drive circuitry 38 may be any type of circuitry (whether or not integrated on the same substrate in which resonators 12-18 reside), and all such circuitry, whether now known or later developed, are intended to fall within the scope of the present invention.

Notably, sense electrodes 28 and 30, and drive electrodes 32 and 34 may be symmetrically configured, which in conjunction with the symmetrical structures of MEMS resonator device 100, manage the stress on resonators 12-18, anchor(s) and the substrate. In this way, coupling junction 24 is a low stress point. As such, in those embodiments where coupling junction 24 includes an anchor, the energy loss of MEMS resonator device 10 may be further minimized, reduced and/or eliminated.

With reference to FIG. 6A, in another embodiment, sense electrodes 28 and 30 and drive electrodes 32 and 34 are located and configured to cause resonators 12-18 to vibrate or resonate, in-plane, and thereby generate output signals that are (or are substantially) 180 degrees out of phase. (See, FIG. 6B). It should be noted that there are many other configurations and or architectures of the sense and drive electrodes that cause resonators 12-18 to generate and/or produce output signals that are (or are substantially) 180 degrees out of phase. All such configurations and/or architectures are intended to fall within the scope of the present invention. Notably, in these embodiments, the driving electrodes induce or cause motion which is in the plane of MEMS resonator device 10 and the sensing electrodes sense/measure that motion.

Figure 7A:
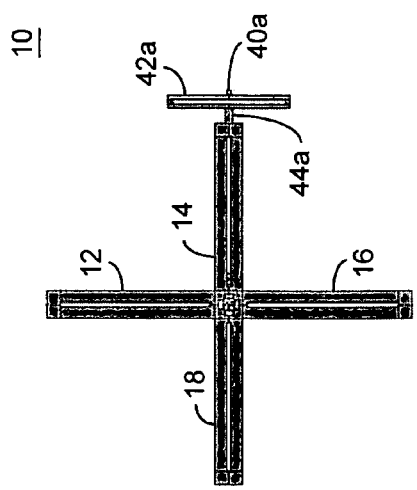
FIGS. 7A and 7B are top views of embodiments of a microelectromechanical resonator device according to an aspect of the invention, wherein the microelectromechanical resonator device includes a plurality of in-plane vibration microelectromechanical tuning fork resonators wherein one or more of the tuning fork resonators are coupled to stress/strain relief mechanisms which are mechanically connected to anchors, which are fixed to a substrate.
Figure 7B:
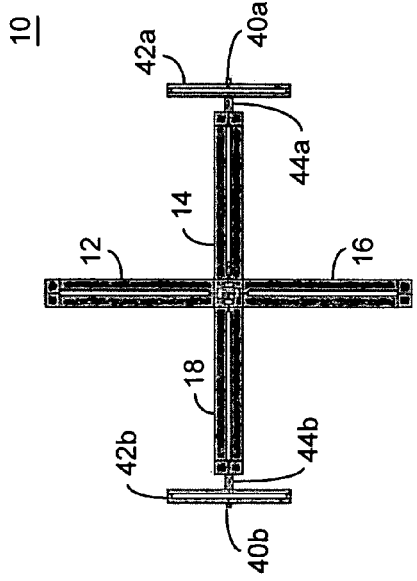
Figure 7D:
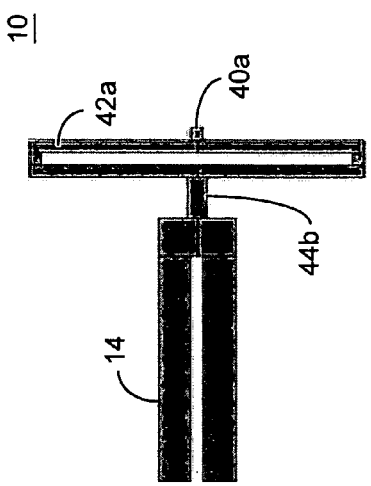
FIG. 7D is a top view of a portion of one or the microelectromechanical resonators of FIGS. 7A and 7C coupled to stress/strain relief mechanisms, which is mechanically connected to an anchor, wherein the anchor is fixed to a substrate.
Figure 7C:
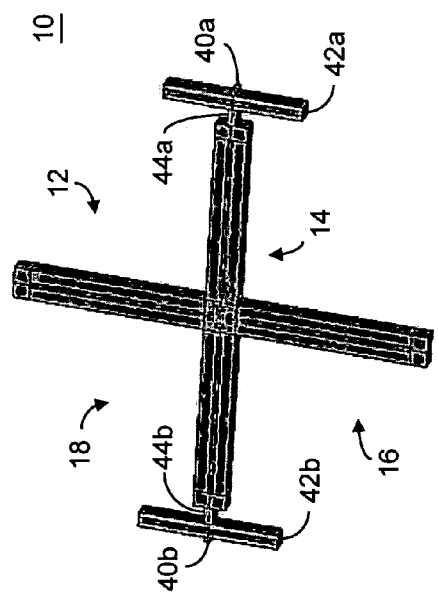
FIG. 7C is an oblique view of the microelectromechanical resonator device of FIG. 7B.

The MEMS resonator device 10 may be anchored to the substrate using a variety of anchoring techniques and/or configurations. In one embodiment, in addition to or in lieu of a "center" anchor (see, for example, FIGS. 3C and 4B), MEMS resonator device 10 may include anchors located at a distal end of one or more resonators 12-18. (See, for example, FIGS. 7A and 7B). For example, in one embodiment, with reference to FIGS. 7B-7D, anchors 40a and 40b may be located at distal ends of resonators 14 and 18, respectively. This anchoring configuration may be advantageous because the distal ends of resonators 12-18 are relatively motionless node points of MEMS resonator device 10, at which vertical and horizontal energy losses of MEMS resonator device 10 are minimized.

In one embodiment, stress/strain relief mechanisms 42a and 42b (for example, springs) may be employed to reduce, eliminate and/or minimize any stress or strain on the substrate at the location of the anchor which is caused by the motion of one, some or all of resonators 12-18. The resonators 14 and 18 are mechanically coupled to stress/strain relief mechanisms 42a and 42b, respectively, via mechanical couplers 44a and 44b, respectively. Notably, in operation, stress/strain relief mechanisms 42a and 42b expand or contract in conjunction with the motion of one, some or all of resonators 12-18 in order to reduce, eliminate and/or minimize any stress or strain on the substrate. (See, for example, FIGS. 8A and 8B). In this way, the anchoring architecture of MEMS resonator device 10 may be relatively stress-free and/or strain-free which may significantly decrease, reduce, minimize and/or eliminate any anchor energy loss and thereby increase, enhance, maximize the Q (and output signal) of device 10.

Notably, stress/strain relief mechanism 42 and mechanical coupler 44, in addition to decreasing, reducing, minimizing and/or eliminating anchor energy, also suspend resonators 12-18 of MEMS resonator device 10 above the substrate.

There are many inventions described and illustrated herein. While certain embodiments, features, materials, configurations, attributes and advantages of the inventions have been described and illustrated, it should be understood that many other, as well as different and/or similar embodiments, features, materials, configurations, attributes, structures and advantages of the present inventions that are apparent from the description, illustration and claims. As such, the embodiments, features, materials, configurations, attributes, structures and advantages of the inventions described and illustrated herein are not exhaustive and it should be understood that such other, similar, as well as different, embodiments, features, materials, configurations, attributes, structures and advantages of the present inventions are within the scope of the present invention.

Figure 9:
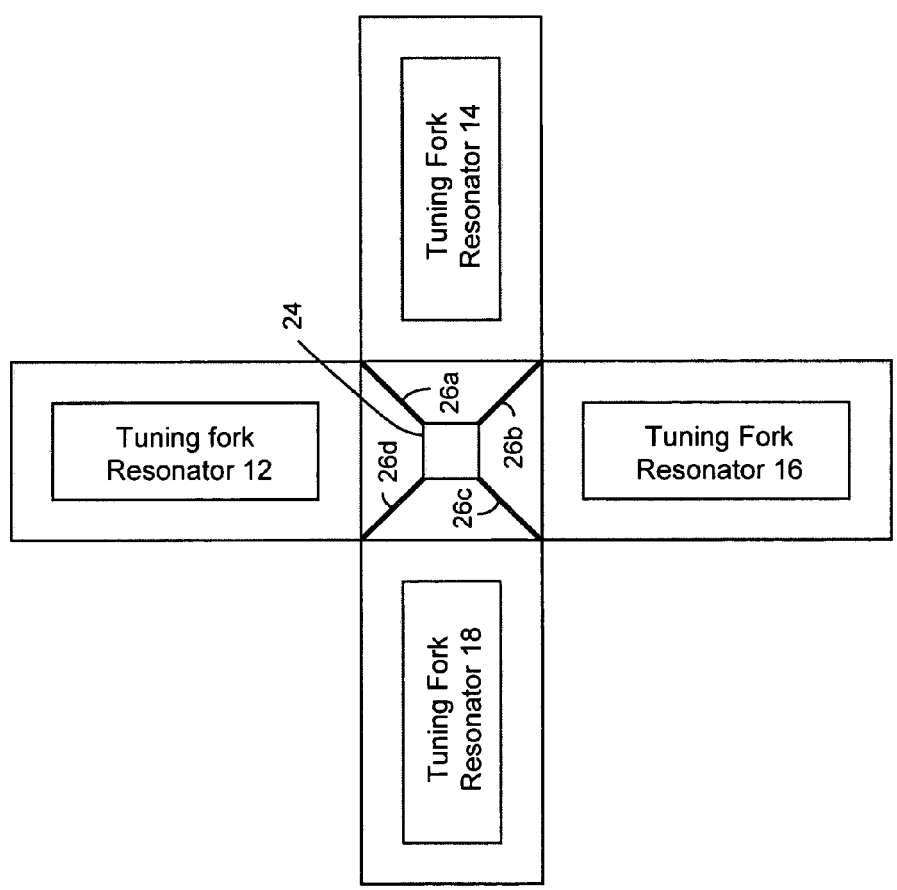
FIG. 9 is a top view of another embodiment of a resonator device, including a plurality of in-plane vibration microelectromechanical tuning fork resonators, according to an aspect of present invention.

For example, as mentioned above, resonators 12-18 may be four commonly shaped microelectromechanical tuning fork resonators (for example, four rectangular-shaped or square-shaped turning fork resonators). Although resonators 12-18 have been generally illustrated in the context of four rectangular-shaped resonators, such resonators, however, may be square-shaped resonators (see, FIG. 9) or any other shape which provides a tuning fork configuration. The square-shaped resonators may be mechanically coupled to another one of the resonators (in a daisy chained fashion) on one side. In this way, resonators 12-18, when induced, vibrate in the plane of resonators 12-18 and at the same frequency.

Notably, a plurality of square-shaped tuning fork resonators of the MEMS resonator device may employ the sense and drive techniques as discussed and illustrated above with respect to the rectangular-shaped tuning fork resonators. For the sake of brevity, those discussions will not be repeated but will be incorporated herein by reference.

As mentioned above, resonators 12-18 may be identically or substantially identically shaped in order to generally provide the same frequency when induced to vibrate by the drive circuitry. It should be noted, however, that MEMS resonator device 10 may include resonators 12-18 having different shapes and/or designs provided that each resonator 12-18 resonates at the same or substantially the same frequency.

Figure 10:
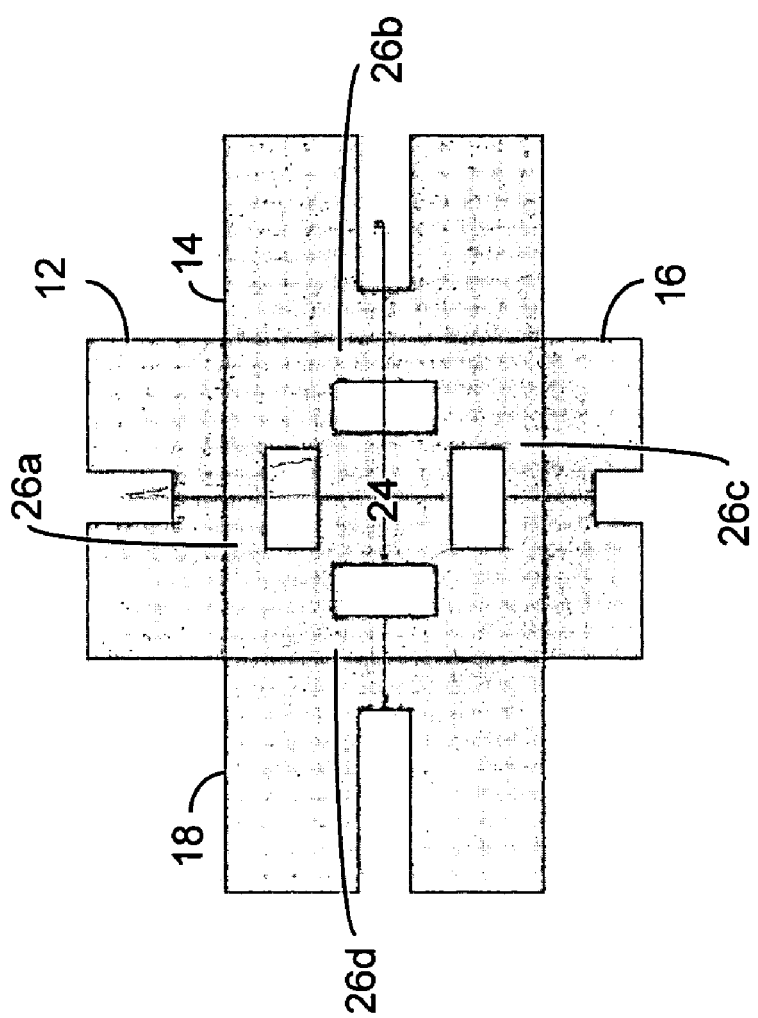
FIG. 10 is a top view of another embodiment of the coupling junction of microelectromechanical resonator device of FIG. 3A.

In addition, resonators 12-18 may be coupled to each other using many different configurations or architectures. For example, with reference to FIG. 10, in one embodiment, each resonator 12-18 may be mechanically coupled to the other resonators 12-18 whereby the junction supports 26 cover a larger area of the proximal end of resonators 12-18. Notably, all resonator coupling configurations or architectures are intended to fall within the scope of the present invention.

The MEMS resonator device 10 of the present invention may be fabricated and/or packaged using a variety of techniques, for example, thin film techniques, substrate bonding techniques (for example, bonding semiconductor or glass-like substrates) and prefabricated package (for example, a TO-8 "can"). Indeed, any fabrication and/or packaging techniques may be employed, whether now known or later developed. As such, all such fabrication and/or packaging techniques are intended to fall within the scope of the present invention. For example, the systems, devices and/or techniques described and illustrated in the following non-provisional patent applications may be implemented:

(1) "Electromechanical System having a Controlled Atmosphere, and Method of Fabricating Same", which was filed on Mar. 20, 2003 and assigned Ser. No. 10/392,528;

(2) "Microelectromechanical Systems, and Method of Encapsulating and Fabricating Same", which was filed on Jun. 4, 2003 and assigned Ser. No. 10/454,867; and (3) "Microelectromechanical Systems Having Trench Isolated Contacts, and Methods of Fabricating Same", which was filed on Jun. 4, 2003 and assigned Ser. No. 10/455,555;

The inventions described and illustrated in the aforementioned patent applications may be employed to fabricate MEMS resonator 10 (including resonators 12-18) of the present inventions. For the sake of brevity, those discussions will not be repeated. It is expressly noted, however, that the entire contents of the aforementioned patent applications, including, for example, the features, attributes, alternatives, materials, techniques and/or advantages of all of the inventions/embodiments, are incorporated by reference herein.

In addition, MEMS resonator device 10, including resonators 12-18, coupling junction 24 and/or stress/strain relief mechanism 42) may employ any anchoring technique or anchor structure, whether now known or later developed. For example, the present invention may employ the anchoring techniques described and illustrated in non-provisional patent application entitled "Anchors for Microelectromechanical Systems Having an SOI Substrate, and Method for Fabricating Same", which was filed on Jul. 25, 2003 and assigned Ser. No. 10/627,237 (hereinafter "Anchors for Microelectromechanical Systems Patent Application"). It is expressly noted, however, that the entire contents of the Anchors for Microelectromechanical Systems Patent Application, including, for example, the features, attributes, alternatives, materials, techniques and advantages of all of the embodiments and/or inventions, are incorporated by reference herein.

Figure 11B:
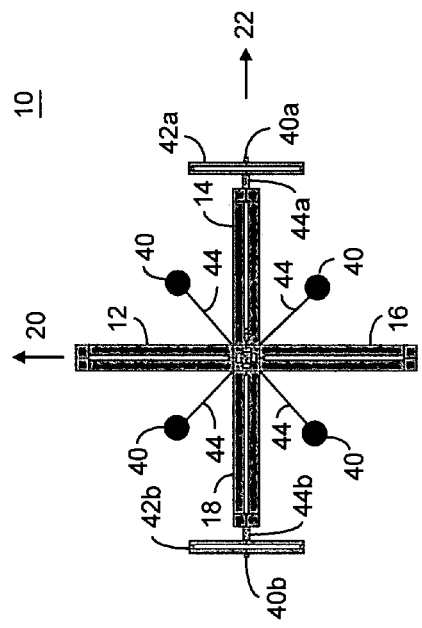
FIGS. 11A, 11B and 11C illustrate microelectromechanical resonator devices according to additional embodiments of the plurality of microelectromechanical tuning fork resonators, in conjunction with various anchoring techniques and/or architectures for securing the resonator devices to the substrate, according to other aspect of present invention.
Figure 11A:
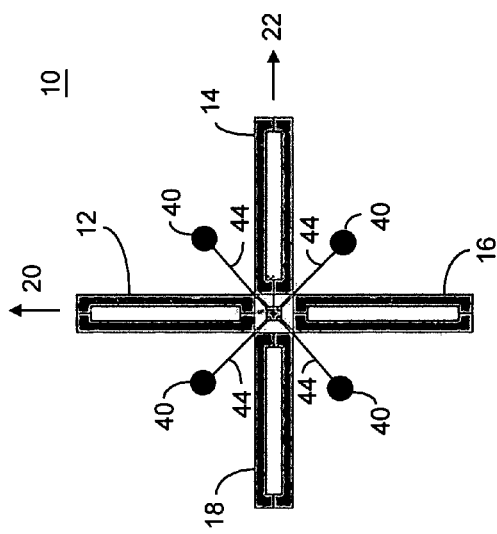
Figure 11C:
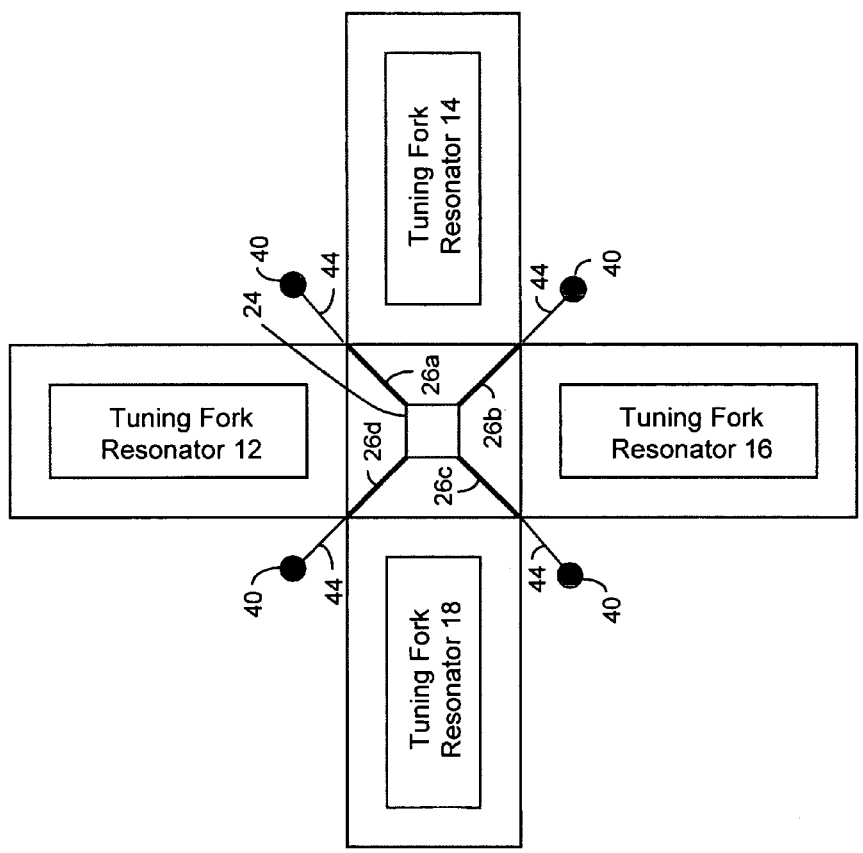

Further, as mentioned above, the anchors may be placed at one, some or all of resonators 12-18. (See, for example, FIGS. 7A and 7B). Other anchor locations are suitable. For example, two or more anchors 40 may be disposed in a symmetrical manner in or around a "center" of MEMS resonator device 10. (See, for example, FIGS. 11A-11C).

The MEMS resonator of the present inventions may be fabricated from well-known materials using well-known techniques. For example, the MEMS resonator may be fabricated from well-known semiconductors such as silicon, germanium, silicon-germanium or gallium-arsenide. Indeed, the MEMS resonator may be comprised of, for example, materials in column IV of the periodic table, for example silicon, germanium, carbon; also combinations of these, for example, silicon germanium, or silicon carbide; also of III-V compounds for example, gallium phosphide, aluminum gallium phosphide, or other III-V combinations; also combinations of III, IV, V, or VI materials, for example, silicon nitride, silicon oxide, aluminum carbide, or aluminum oxide; also metallic silicides, germanides, and carbides, for example, nickel silicide, cobalt silicide, tungsten carbide, or platinum germanium silicide; also doped variations including phosphorus, arsenic, antimony, boron, or aluminum doped silicon or germanium, carbon, or combinations like silicon germanium; also these materials with various crystal structures, including single crystalline, polycrystalline, nanocrystalline, or amorphous; also with combinations of crystal structures, for instance with regions of single crystalline and polycrystalline structure (whether doped or undoped).

Moreover, the MEMS resonator device according to the present inventions may be formed in or on semiconductor on insulator (SOI) substrate using well-known lithographic, etching, deposition and/or doping techniques. For the sake of brevity, such fabrication techniques are not discussed herein. However, all techniques for forming or fabricating the resonator structure of the present invention, whether now known or later developed, are intended to fall within the scope of the present invention (for example, well-known formation, lithographic, etching and/or deposition techniques using a standard or over-sized ("thick") wafer (not illustrated) and/or bonding techniques (i.e., bonding two standard wafers together where the lower/bottom wafer includes a sacrificial layer (for example, silicon oxide) disposed thereon and the upper/top wafer is thereafter thinned (ground down or back) and polished to receive the mechanical structures in or on).

Notably, the SOI substrate may include a first substrate layer (for example, a semiconductor (such as silicon), glass or sapphire), a first sacrificial/insulation layer (for example, silicon dioxide or silicon nitride) and a first semiconductor layer (for example, silicon, gallium arsenide or germanium) disposed on or above the sacrificial/insulation layer. The mechanical structure may be formed using well-known lithographic, etching, deposition and/or doping techniques in or on the first semiconductor layer (for example, semiconductors such as silicon, germanium, silicon-germanium or gallium-arsenide).

In one embodiment, the SOI substrate may be a SIMOX wafer which is fabricated using well-known techniques. In another embodiment, the SOI substrate may be a conventional SOI wafer having a first semiconductor layer. In this regard, SOI substrate, having a relatively thin first semiconductor layer, may be fabricated using a bulk silicon wafer which is implanted and oxidized by oxygen to thereby form a relatively thin $SiO_2$ beneath or underneath the single or mono crystalline wafer surface. In this embodiment, the first semiconductor layer (i.e., monocrystalline silicon) is disposed on the first sacrificial/insulation layer (i.e. silicon dioxide) which is disposed on a first substrate layer (i.e., monocrystalline silicon in this example).

A micromechanical tuning fork resonator may be characterized as micromechanical structure having two or more elongated tines or members that are attached to one another at one or more ends of the tines or members; the tines or members may be parallel or substantially parallel and close to one another relative to their length; and the tines or members mechanically resonate in a mode where the tines or members move toward and away from one another in opposition.

As mentioned above, the above embodiments of the present invention are merely exemplary. They are not intended to be exhaustive or to limit the inventions to the precise forms, techniques, materials and/or configurations disclosed. Many modifications and variations are possible in light of the above teaching. It is to be understood that other embodiments may be utilized and operational changes may be made without departing from the scope of the present invention. As such, the foregoing description of the exemplary embodiments of the invention has been presented for the purposes of illustration and description. Many modifications and variations are possible in light of the above teaching. It is intended that the scope of the invention not be limited solely to this detailed description.

What is claimed is:

1. A resonator array for providing at least one output signal, the resonator array comprising:
   a plurality of in-plane vibration microelectromechanical tuning fork resonators, including:
   a first resonator having two or more tines, wherein each tine of the first resonator includes a distal end and a proximal end;
   a second resonator, having a distal end and a proximal end, wherein the proximal end of the second resonator is mechanically coupled to the proximal end of the first resonator, and wherein the shape of the second resonator is substantially identical to the first resonator;
   a third resonator, having a distal end and a proximal end, wherein the proximal end of the third resonator is mechanically coupled to the proximal end of the second resonator, and wherein the shape of the third resonator is substantially identical to the second resonator; and
   a fourth resonator, having a distal end and a proximal end, wherein the proximal end of the fourth resonator is mechanically coupled to the proximal end of the first resonator, and wherein the shape of the fourth resonator is substantially identical to the third resonator.

2. The resonator array of claim 1 wherein:
   a first corner of the proximal end of the first resonator is mechanically coupled to a first corner of the proximal end of the second resonator;
   a second corner of the proximal end of the second resonator is mechanically coupled to a second corner of the proximal end of the third resonator;
   a first corner of the proximal end of the third resonator is mechanically coupled to a first corner of the proximal end of the fourth resonator; and
   a second corner of the proximal end of the fourth resonator is mechanically coupled to a second corner of the proximal end of the first resonator.

3. The resonator array of claim 1 further including a coupling junction wherein the proximal end of each of resonator is mechanically coupled to the coupling junction via coupling supports.

4. The resonator array of claim 3 wherein the coupling junction includes an anchor to fix the resonator array to a substrate.

5. The resonator array of claim 1 further including:
   a first anchor to fix the resonator array to a substrate; and
   a first stress/strain relief mechanism coupled to the first anchor and the distal end of the first resonator.

6. The resonator array of claim 5 further including:
   a second anchor to fix the resonator array to a substrate; and
   a second stress/strain relief mechanism coupled to the second anchor and the distal end of the third resonator.

7. The resonator array of claim 1 wherein each of the first, second, third and fourth resonators are substantially rectangular in shape.

8. A resonator array for providing at least one output signal, the resonator array comprising:
   a plurality of in-plane vibration microelectromechanical tuning fork resonators, including:
   a first resonator having two or more tines that are substantially rectangular in shape, wherein each tine of the first resonator includes a distal end and a proximal end
   a second resonator, having a distal end and a proximal end, wherein a corner of the proximal end of the second resonator is mechanically coupled to a corner of the proximal end of the first resonator, and wherein the shape of the second resonator is substantially identical to the first resonator;
   a third resonator, having a distal end and a proximal end, wherein a corner of the proximal end of the third resonator is mechanically coupled to a corner of the proximal end of the second resonator, and wherein the shape of the third resonator is substantially identical to the second resonator; and
   a fourth resonator, having a distal end and a proximal end, wherein a corner of the proximal end of the fourth resonator is mechanically coupled to a corner of the proximal end of the first resonator, and wherein the shape of the fourth resonator is substantially identical to the third resonator; and
   a coupling junction wherein the proximal end of each of resonator is mechanically coupled to the coupling junction via coupling supports.

9. The resonator array of claim 8 wherein the coupling junction includes an anchor to fix the resonator array to a substrate.

10. The resonator array of claim 8 further including:
a first anchor to fix the resonator array to a substrate; and
a first stress/strain relief mechanism coupled to the first anchor and the distal end of the first resonator.

11. The resonator array of claim 10 further including:
a second anchor to fix the resonator array to a substrate; and
a second stress/strain relief mechanism coupled to the second anchor and the distal end of the third resonator.

12. A resonator array for providing at least one output signal, the resonator array comprising:
a plurality of in-plane vibration microelectromechanical tuning fork resonators, including:
a first resonator having a plurality of tines, wherein each tine of the first resonator includes a distal end and a proximal end; and
a second resonator, having a distal end and a proximal end, wherein a corner of the proximal end of the second resonator is mechanically coupled to a corner of the proximal end of the first resonator, and wherein the shape of the second resonator is substantially identical to the first resonator;
a coupling junction wherein the proximal end of each of resonator is mechanically coupled to the coupling junction via coupling supports;
a first anchor to fix the resonator array to a substrate; and
a first stress/strain relief mechanism coupled to the first anchor and the distal end of the first resonator.

13. The resonator array of claim 12 further including:
a second anchor to fix the resonator array to a substrate; and
a second stress/strain relief mechanism coupled to the second anchor and the distal end of the second resonator.

14. The resonator array of claim 12 wherein the plurality of in-plane vibration microelectromechanical tuning fork resonators include:
a third resonator, having a distal end and a proximal end, wherein a corner of the proximal end of the third resonator is mechanically coupled to a corner of the proximal end of the second resonator, and wherein the shape of the third resonator is substantially identical to the second resonator; and
a fourth resonator, having a distal end and a proximal end, wherein a corner of the proximal end of the fourth resonator is mechanically coupled to a corner of the proximal end of the first resonator, and wherein the shape of the fourth resonator is substantially identical to the third resonator.

* * * * *